United States Patent [19]
Makhija

[11] Patent Number: 6,037,778
[45] Date of Patent: Mar. 14, 2000

[54] ELECTRONIC BATTERY TESTING DEVICE AND METHOD FOR TESTING BATTERIES

[75] Inventor: Surender K Makhija, Brookfield, Wis.

[73] Assignee: STAT Engineering Company, L.L.C., Waukesha, Wis.

[21] Appl. No.: 08/964,489

[22] Filed: Nov. 5, 1997

[51] Int. Cl.[7] .................................................. G01N 27/416
[52] U.S. Cl. ........................... 324/433; 324/429; 324/427
[58] Field of Search ..................... 324/426, 427, 324/429, 433; 340/636; 320/134, 136

[56] References Cited

U.S. PATENT DOCUMENTS

| | | | |
|---|---|---|---|
| 3,593,099 | 7/1971 | Scholl | 324/429 |
| 3,607,673 | 9/1971 | Seyl | 204/404 |
| 3,753,094 | 8/1973 | Furuishi et al. | 324/430 |
| 3,873,911 | 3/1975 | Champlin | 324/430 |
| 3,889,248 | 6/1975 | Ritter | 340/636 |
| 3,909,708 | 9/1975 | Champlin | 324/431 |
| 4,080,560 | 3/1978 | Abert | 324/429 |
| 4,193,025 | 3/1980 | Frailing et al. | 324/427 |
| 4,204,153 | 5/1980 | Brown | 324/429 |
| 4,290,021 | 9/1981 | Theron et al. | 324/429 |
| 4,396,880 | 8/1983 | Windebank | 320/156 |
| 4,423,378 | 12/1983 | Marino et al. | 324/427 |
| 4,433,294 | 2/1984 | Windebank | 324/426 |
| 4,659,994 | 4/1987 | Poljak | 324/426 |
| 4,707,795 | 11/1987 | Alber et al. | 324/433 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 5,140,269 | 8/1992 | Champlin | 324/433 |
| 5,438,270 | 8/1995 | Harper et al. | 324/429 |
| 5,519,383 | 5/1996 | De La Rosa | 340/636 |
| 5,572,136 | 11/1996 | Champlin | 324/426 |
| 5,574,355 | 11/1996 | McShane et al. | 320/161 |
| 5,585,728 | 12/1996 | Champlin | 324/427 |
| 5,592,093 | 1/1997 | Klingbiel | 324/426 |
| 5,598,098 | 1/1997 | Champlin | 324/430 |
| 5,608,385 | 3/1997 | Masaki | 324/433 |
| 5,640,081 | 6/1997 | Austin et al. | 324/426 |
| 5,687,387 | 11/1997 | Patino | 324/427 |
| 5,744,962 | 4/1998 | Alber et al. | 324/426 |
| 5,751,217 | 5/1998 | Kchao et al. | 324/426 |

*Primary Examiner*—Diep N. Do
*Attorney, Agent, or Firm*—Dicke, Billig & Czaja, P.A.

[57] ABSTRACT

An electronic battery testing device and a method for testing batteries are provided. Device applies a small first fixed load and measures the voltage at the end of the first fixed load and then applies a medium second fixed load and measures the voltage at the end of the second fixed load. The device then analyzes the condition of the battery based on these voltage values. A method is also provided involving: (a) applying a first small fixed load to a battery, (b) measuring the voltage at the end of the first small fixed load, (c) applying a second medium fixed load to the battery, (d) measuring the voltage of the battery at the end of the second medium fixed load, and (e) analyzing the condition of the battery based on the voltage values. Preferably the method also involves evaluating the recovery voltage wave form after the second medium load. The device and method allowed for evaluation of deeply discharged batteries without the need to charge the batteries and also allows for the test equipment to be in hand held form.

26 Claims, 12 Drawing Sheets

ELECTRONIC BATTERY TESTING DEVICE AND METHOD FOR TESTING BATTERIES

BACKGROUND INVENTION

1. Field of the Invention

The present invention relates to battery testers and methods for testing batteries, and more particularly relates to testers useful for testing automotive batteries and methods useful for testing automotive batteries.

2. Description of the Related Art

Current methods for determining the condition of lead acid batteries (automotive batteries) are based upon the measurement of the internal resistance or dynamic conductance of the battery. Internal resistance or dynamic conductance value as compared to the size and state of the charge of the battery under test to determine its condition. The conventional direct current methods have typically involved measuring the internal resistance of the battery based on Ohm's law. The internal resistance of the battery is calculated by $R_i = V_{ocv} - V_{load}/I_{load}$. It has been found that internal resistance of the battery measured by a direct current method varies with the current ($I_{load}$). Internal resistance of the battery is higher as the current is made smaller. Conventional methods used to measure the internal resistance of the battery have typically used very high direct current for example 50 amps or more. Using very high direct current minimizes the effect of changes in internal resistance due to change in the test current. While the high direct current method has proven to have certain advantages, it has also exhibited certain disadvantages, including typically requiring very bulky and expensive test equipment, requiring that the battery have enough charge in order to perform the test, and requiring the use of very high currents which change the condition of the battery temporarily so that test results are not repeatable. Consequently, there is a desire to provide test methods and equipment which overcome these disadvantages.

Other methods used for determining the condition of lead acid batteries have involved measuring the dynamic conductance/resistance of the battery by charging the battery by a time varying voltage making periodic step transitions at a pre-determined frequency between two discreet levels or exciting the battery by a time varying discharge current making periodic transitions between levels at a pre-determined frequency. Corresponding periodic change in battery terminal voltage is monitored to calculate the battery dynamic conductance/resistance. Battery terminal voltages change periodically and can be separated from the battery direct current voltage and amplified for measurement, thereby allowing the use of very small charge or discharge current and the apparatus required for making the internal resistance measurement typically requires a lesser amount of hardware than the very high direct current method. Thus, the above method allows for determining the condition of the battery and the utilization of hand held testers. However, such conventional dynamic methods involve various disadvantages. These disadvantages include relying on the open circuit voltage to determine the state of charge of the battery which can be very misleading due to several reasons including (a) the presence of surface charge which can greatly affect the open circuit voltage, (b) the battery was under charge or discharge conditions and was not allowed to stabilize for sufficient time, thereby permitting the open circuit voltage reading to be very misleading for judging the state of charge, and (c) variations in the design and construction of the battery can have a great influence on the open circuit voltage which in turn may not be a very good indicator of the state of charge of the battery for the wide population of automotive batteries designed for different applications. Additional problems with dynamic tests include that dynamic conductance/resistance varies significantly with the state of charge, and specifically provides difficulties associated with the measurement of exact state of charge in a deep discharge state, and more specifically cannot effectively diagnosis batteries which are deeply discharged.

Both of the above conventional methods are widely used, however they have exhibited great difficulty in diagnosing battery conditions when the batteries are deeply discharged since both methods depend upon the internal resistance or dynamic conductance/resistance measurement, which changes with the state of charge of the battery. When the battery is completely discharged or deeply discharged, it is very difficult to assess its state of charge by the above methods.

Consequently, there is a need and a desire to provide a device which can be in a light weight, handheld form, and which can provide an accurate diagnosis of batteries in very discharged state.

Various prior electronic battery testing devices and methods are set out as follows:

Klingbiel U.S. Pat. No. 5,592,093 issued Jan. 7, 1997 which discloses an electronic battery testing device which utilizes a bridge circuit and amplified output to indicate presence of a loose connection; Champlin U.S. Pat. No. 5,140,629 issued Aug. 18, 1992 which discloses an electronic tester involving a dynamic conductance method; Champlin U.S. Pat. No. 4,825,170 issued Apr. 25, 1989 which discloses an electronic battery testing device which utilizes a dynamic conductance measurement method; Champlin U.S. Pat. No. 5,598,098 issued Jan. 28, 1997 which discloses an electronic battery tester which uses a dynamic conductance measurements involving; Champlin U.S. Pat. No. 5,572,136 issued Nov. 5, 1996 which discloses an electronic battery testing device which utilizes a time varying current signal measuring internal resistance; Champlin U.S. Pat. No. 4,816,768 issued Mar. 28, 1989 which discloses utilization of an electronic battery testing device for measuring dynamic conductance; Harper, et al. U.S. Pat. No. 5,438,270 issued Aug. 1, 1995 which discloses a battery tester comparing load and no load battery voltage utilizing a potential divider coupled to the battery; McShane, et al. U.S. Pat. No. 5,574,355 issued Nov. 12, 1996 which discloses a method and apparatus for detection and control of thermal runaway in battery undercharged involving determining internal resistance or conductance of the battery undercharge; Champlin U.S. Pat. No. 5,585,728 issued Dec. 17, 1996 which discloses an electronic tester with compensation for low state of charge for measuring dynamic conductance; Champlin U.S. Pat. No. 3,909,708 issued Sep. 30, 1975 which discloses an electronic battery testing device for making dynamic measurements; Champlin U.S. Pat. No. 3,873,911 issued Mar. 25, 1975 which utilizes an oscillator in the measurement of dynamic resistance; Windebank U.S. Pat. No. 4,433,294 issued Feb. 21, 1984 which discloses a method and apparatus for testing a battery by obtaining the dynamic voltage-current characteristic of the battery; Poljack U.S. Pat. No. 4,659,994 issued Apr. 21, 1987 which discloses a battery tester having first and second flip-flop means for testing lithium sulfur dioxide batteries; Windebank U.S. Pat. No. 4,396,880 issued Aug. 2, 1993 which discloses a method and apparatus for charging a battery involving evaluating the dynamic voltage/current characteristic of the battery; De La rosa U.S. Pat. No. 5,519,383 which discloses a battery and starter circuit monitoring system; Champlin U.S. Pat. No. 4,881,038 issued Nov. 14, 1989 which discloses an electronic battery device with automatic voltage scaling to determine dynamic conductance; Ritter U.S. Pat. No. 3,889,248 issued Jun. 10, 1975 which discloses a faulty battery connection indicator; Seyl U.S. Pat. No. 3,607,673 which discloses a method for measuring corrosion rates in a battery; Champlin U.S. Pat. No. 4,816,768 issued Mar. 28, 1989 which discloses an electronic battery testing device for measuring dynamic conductance; Champlin U.S. Pat. No. 4,912,416 issued Mar. 27, 1990 which discloses an electronic battery testing device with state of charge compensation; Abert U.S. Pat. No. 4,080,560 which discloses a method and apparatus for determining the maintenance and charge condition of lead acid storage batteries utilizing a heavy current load; Theron, et al. U.S. Pat. No. 4,290,021 issued Sep. 15, 1981 which discloses a battery testing method and device; Reni, et al. U.S. Pat. No. 5,352,968 issued Oct. 4, 1994 which discloses a method and apparatus for determining the charged state of a battery; Furuishi, et al. U.S. Pat. No. 3,753,094 issued Aug. 14, 1973 which discloses a method and device for measuring the internal resistance of a battery; Frailing, et al. U.S. Pat. No. 4,193,025 which discloses an automatic battery analyzer; Ottone U.S. Pat. No. 4,352,067 which discloses a battery analyzer utilizing a load bank to maintain a plurality of resisters in selective parallel interconnection; Marion, et al. U.S. Pat. No. 4,423,378 issued Dec. 27, 1983 which involves automotive battery test apparatus testing dynamic internal resistance of a battery; Alber, et al. U.S. Pat. No. 4,707,795 which discloses battery testing and monitoring system for continuously monitoring a battery voltage; McShane, et al. U.S. Pat. No. 5,574,355 issued Nov. 12, 1996 which discloses a method and apparatus for detection and control of thermal runaway in a battery under charge, all of which are incorporated herein by reference. As set out above, these prior methods and devices suffer from one or more problems which are overcome by the present method and device.

SUMMARY OF THE INVENTION

An electronic battery testing device and a method for testing batteries are provided. The device applies a small first fixed load and measures the voltage at the end of the first fixed load and then applies a medium second fixed load and measures the voltage at the end of the second fixed load (the second fixed load may be in the form of a separate second fixed load or be in the form of the total effect of the first fixed load and an additional fixed load). The device then analyzes the condition of the battery based on these voltage values. A method is also provided involving: (a) applying a first small fixed load to a battery, (b) measuring the voltage at the end of the first small fixed load, (c) applying a second medium fixed load to the battery, (d) measuring the voltage of the battery at the end of the second medium fixed load, and (e) analyzing the condition of the battery based on the voltage values. Preferably the method also involves evaluating the recovery voltage wave form of the battery after the second medium load. The device and method allowed for evaluation of batteries without the need to charge the batteries, and also provides for improved accuracy in the evaluation of the condition of deeply discharged battery and allows for the test equipment to be in hand held form.

DETAILED DESCRIPTION OF THE INVENTION

Figure 6:
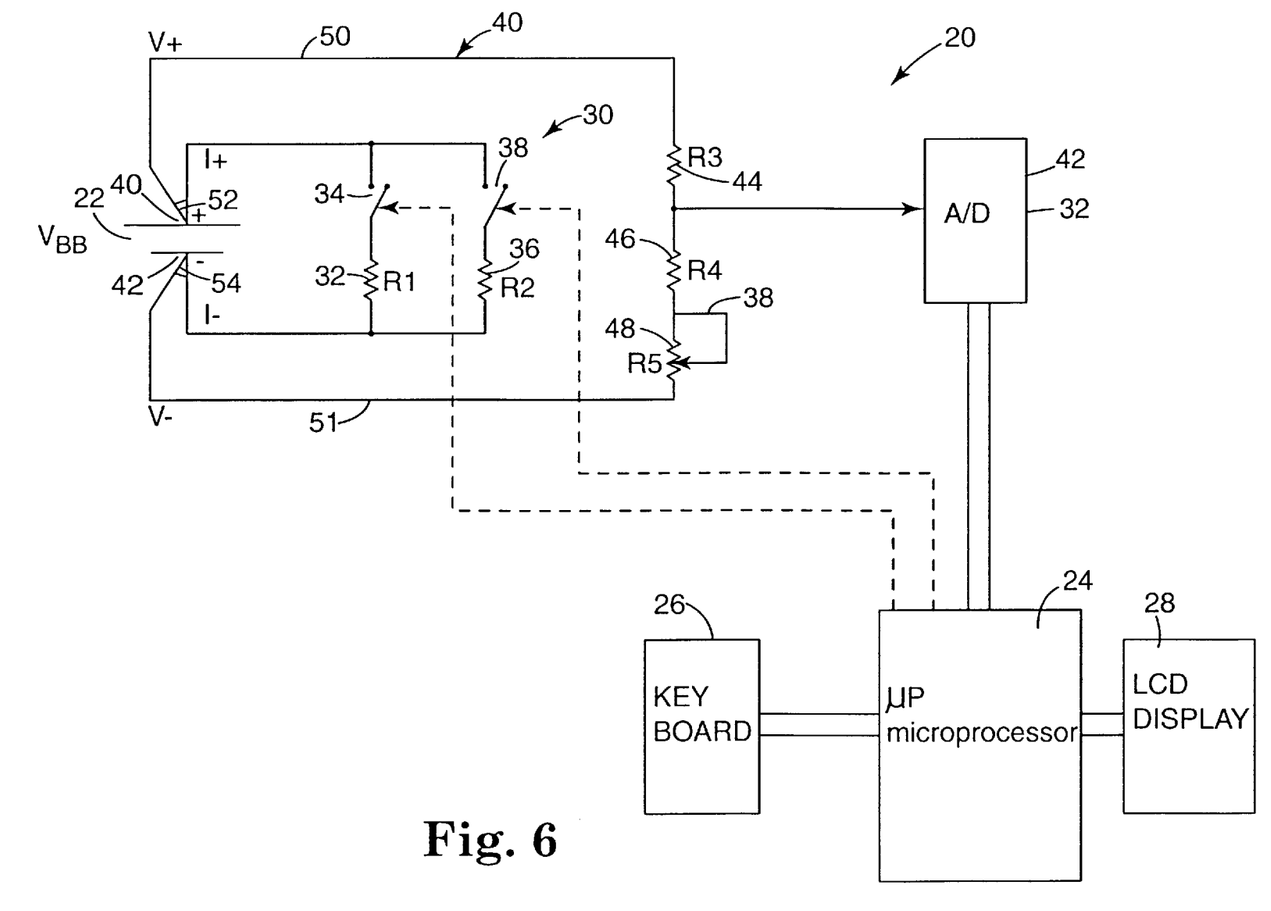
FIG. 6 is a schematic diagram of the device of the present invention attached to a battery for testing.

As best shown in FIG. 6, a battery tester device (20) is connected to a battery (22) for testing the battery (22) to determine the condition of the battery (22). The device (20) preferably comprises (a) a microprocessor (microcontroller) (24), (b) a keyboard (26) for manually inputting to the processor (24), (c) a display (liquid crystal display, LCD) (28) for providing alphanumeric information regarding the condition of the battery (22) based on analysis by the microprocessor (24); (d) an analog-to-digital converter (42); and (e) a load circuit (30) for applying a selected fixed load to the battery (22). The load circuit (30) comprises (i) a first resistor (R1) (32) for applying a first small load to the battery (22) when a first switch (gate) (34) is closed and (ii) a second resistor (resistor subcircuit)(R2) (36) for applying an additional second medium load to the battery (22) when a second switch (gate) (38) is closed and first switch (34) remains closed. The switches (34, 38) are selectively controlled by the microprocessor (24) so that the first load is initially applied to the battery (22) to condition the battery (22) prior to applying the larger second load (additional load) to the battery (22). A voltage measurement circuit (40) is used to measure the voltage of the battery (22) at various times in conjunction with the analog-to-digital converter (32) and the microprocessor (24). The voltage measurement circuit (30) comprises a third fixed resistor (R3) (34), a fourth fixed resistor (R4) (36) and a fifth variable resistor (R5) (38). The analog-to-digital converter (42) is connected to the voltage measurement circuit (40) at a point between the third resistor (R3)(44) and the fourth resistor (R4)(46) thereby providing one side of the circuit (40) with the third resistor (R3)(34) and the other side of the circuit (40) having the fourth resistor (R4) (46) and a fifth resistor (R5)(48). The voltage measurement circuit (40) will be utilized for measuring (i) the open circuit voltage (ii) the voltage at the end of the first load, (iii) the voltage at the end of the second load (the end of the first load plus an additional load), and (iv) the voltages associated with voltage recovery wave form after (removal of) the second load (after removal of the first load and the additional load).

The device (20) of the present invention is useful for practicing the method of the present invention. The method is a method for evaluating the condition of a direct current energy storage unit (battery) (22). Broadly, the method comprises(a) applying a first load to the unit (battery) (22), (b) measuring a voltage of the unit (22) at the end of applying the first load, (c) applying a second load (the first load plus an additional load) to the unit (22), the second load being greater than the first load,(the second fixed load may be in the form of a separate second fixed load or be in the form of the total effect of the first fixed load and an additional fixed load)(d) measuring a voltage of the unit (22) at the end of applying the second load, and(e) analyzing the condition of the unit (22) based on the voltage drop between the first load and the second load (between the first load and the combined load of the first load and an additional load). The method preferably involves the first load being between 0.5 and 1.4 amps, more preferably between 1.0 and 1.3 amps, and more preferably about 1.2 amps, and is applied for a time period of between preferably between three seconds and seven seconds, more preferably between 4.0 and 6.0 seconds, and most preferably about 5.0 seconds. The additional load for second load is preferably between 6.0 and 8.0 amps, more preferably between 6.5 and 7.5 amps, and most preferably about 7.2 amps (providing a total second load of preferably between 6.5 amps and 9.4 amps, more preferably between 7.5 and 8.8 amps, and most preferably about 8.4 amps), and is preferably applied for a period of between 1.0 seconds and 4.0 seconds, more preferably between 1.5 and 2.5 seconds, and most preferably about 2.5 seconds. The method preferably also comprises measuring the recovery voltage of the unit (22) for at least one second, preferably at least three seconds, most preferably ten seconds, after removing the second load (removing the first load plus removing the additional load) so that the recovery wave form can be evaluated to determine the capacitive action of the battery (22). In other words, the method preferably comprises analyzing the recovery voltage wave form to determine the condition of the battery (22). In the method, the voltage at the end of the first load is utilized to determine the state of charge of the battery (22). The method also preferably involves comparing the voltage drop from the end of the first load to the end of the second load (end of the first load and the additional load) to determine the condition of the battery (22), and preferably involves comparing the first voltage drop between the open circuit voltage and the end of the first load to the second voltage drop between the voltage at the end of the first load to the voltage at the end of the second load (first load plus additional load). The method also preferably involves determining whether the voltage drop between the end of the first load and the end of the second load is less than a desired level for a given level of voltage at the end of the first load. Where the unit (22) is an automotive battery (22) having a designed full voltage of about 12 volts, the analyzing preferably comprises determining whether the voltage drop between the open circuit voltage and the voltage at the end of the first load is greater than the voltage drop between the voltage at the end of the first load and the voltage at the end of the second load, and determining whether the voltage at the end of the second load is larger than 4.0 volts.

The electronic device (20) of the present invention is useful for determining whether a lead acid automotive battery (22) is defective. The device (20) comprises(a) means for applying a first fixed load to the battery (22), (b) means for applying a second fixed load to the battery (22), the first load being smaller than the second load,(c) means for measuring the voltage of the battery (22), and(d) means for analyzing the condition of the battery (22) based on (i) the voltage at the end of the first load and (ii) the voltage at the end of the second load and/or based on the voltage recovery after removal of the load. The device (20) preferably weighs less than two pounds and is suitable as a hand-held device (20).

The battery testing device (20) of the present invention requires very little hardware, is very accurate and is capable of diagnosing batteries in varied discharge states. The present method instead of just looking at the internal resistance or dynamic conductance of the battery (22), utilizes a symptomatic approach for diagnosing the condition of the battery (22). The present method preferably first looks for some peculiar symptoms which might indicate that there is a gross defect in the battery (22) irrespective of its state of charge or size, and if the battery (22) does not show any gross faults, then the battery (22) is preferably further checked for its relative performance under two different loads as compared against a predetermined value depending on the size of the battery (22). The present method and apparatus provides the ability to diagnose many defective batteries without needing to charge them. The present device (20) and method are especially useful for diagnosing the performance of twelve volt automotive lead acid batteries consisting of six cells and may also be utilized for testing other types of batteries and batteries with various numbers of cells.

The present device (20) and method preferably utilizes two fixed loads (at least two fixed loads) for discharging the battery (22) under test. The first load is a small fixed load (compared to the very large fixed loads used by prior methods) which preferably utilizes a ten ohm resistor (32) (for example 7 ohm to 20 ohm resistor) to discharge the battery (22) for approximately five seconds. The device (20) and method then utilize a second fixed load which is a medium fixed load which preferably utilizes a 1.5 ohm resistor (36) (for example a 0.5 to 3.0 ohm resistor) to discharge the battery (22) for approximately two seconds. The purpose of applying the first load to the battery (22) is to condition the battery (22) before applying the second load and also to make an accurate measurement of the state of charge of the battery (22). The utilization of this first small load with the corresponding voltage determination exhibits several advantages over utilization of the conventional open circuit voltage to assess the state of charge of the battery (22) due in part to the change of the designs of batteries which is making utilization of open circuit voltage as an assessment tool less and less useful. For example, an acid flooded battery can exhibit a deeply discharged condition while maintaining fairly high open circuit voltage since the plates cannot absorb any more acid, thereby making it very misleading when making a determination of the condition of the battery (22) based on the state of charge. The present invention which involves applying a small load, for example, approximately 1.2 amps, to the battery (22) and measuring the voltage ($V_{smallload}$ or $V_{1L5Sec}$) at the end of five seconds by the present invention proves to be a much better indicator of the state of charge of the battery (22) than merely measuring the open circuit voltage. The second fixed load (first load plus an additional load), for example, 7.2 amps, or approximately six times the amperage of the first load, is applied to the battery (22) in addition to the first load for preferably two seconds and the resultant battery voltage ($V_{mediumload}$ or $V_{2L2Sec}$) at the end of two seconds is measured. At the end of two seconds, both loads are removed and the battery recovery voltage is monitored for a period of time, for example one second, preferably at least one second, more preferably at least 3 seconds, and most preferably ten seconds. This voltage measurement during the test is recorded and stored and is used later at the end of the test to diagnose condition of the battery (22).

The dual load (two load) testing procedure of the present invention provides a number of advantages over conventional testing procedures. The voltage measurement at the end of the application of the small fixed load ($V_{smallload}$ or $V_{1L5Sec}$) proves to be a much better indicator of the state of charge of the battery (22) than the open circuit voltage of conventional tests. Also, prior conventional tests have had difficulties when relying on internal resistance of the battery because the internal resistance of the battery measured with direct current methods varies with the amount of load current. The present method which utilizes a small load for a few seconds and then utilizes a medium additional load which is significantly higher than the first load provides a much better indicator of the condition of the battery (22). The first load effectively conditions the battery (22) prior to application of the second load. The voltage drop between the first load and the second load when compared to the size of the battery (22) is a good indicator of the condition of the battery (22) and does not require any state of charge correction down to a very low state of charge of the battery (22). Additionally, a relative comparison of the voltage drop between the initial voltage and the voltage at the end of the first load caused by the first load ($V_{OCV}-V_{1L5Sec}$), and the voltage drop ($V_{1L5Sec}-V_{2L2Sec}$) caused by application of the second load allows for diagnosis of various defective batteries in deep discharge state.

In contrast to the present invention, various commonly used conventional methods rely solely on measurement of internal resistance or dynamic conductance of the battery. The present invention, however, involves a method and device (20) which provide an analysis of certain symptoms in batteries which might indicate the battery (22) is defective irrespective of its state of charge. The method and device (20) also analyze whether there is a symptom indicating a gross fault.

The device (20) and method of the present invention provide for a diagnosis of whether deeply discharged batteries have gross faults without the need to charge them. Conventional attempts to measure battery internal resistance or dynamic conductance/resistance and applying a state of charge correction in order to diagnose batteries in fairly low state of charge have been in reality ineffective at the deeply discharged or near zero state of charge. In other words, conventionally it has been practically impossible to correctly judge the exact state of charge of a battery when it has been near a zero state of charge and attempting to come up with an expected value of internal resistance or dynamic conductance/resistance at that low state of charge in order to diagnose the battery condition. The only choice available under conventional test methods has been typically to instruct the operator to charge the battery and retest. Unfortunately, many batteries which are in need of testing are in deep discharge states either due to a fault in the battery or due to the vehicle electrical system, and consequently when utilizing conventional testing procedures charging of these batteries is required. The present method which utilizes a test procedure (method) (and the present invention which so involves a device (20) which utilizes the present method) utilizes an initial test which identifies gross defects which are not exhibited by good batteries even at zero state of charge. Thus, the present invention provides a method and device (20) which allows for elimination of most of the defective batteries even in deep discharge state thereby allowing diagnosis of them without needing to first charge them.

Figure 1:
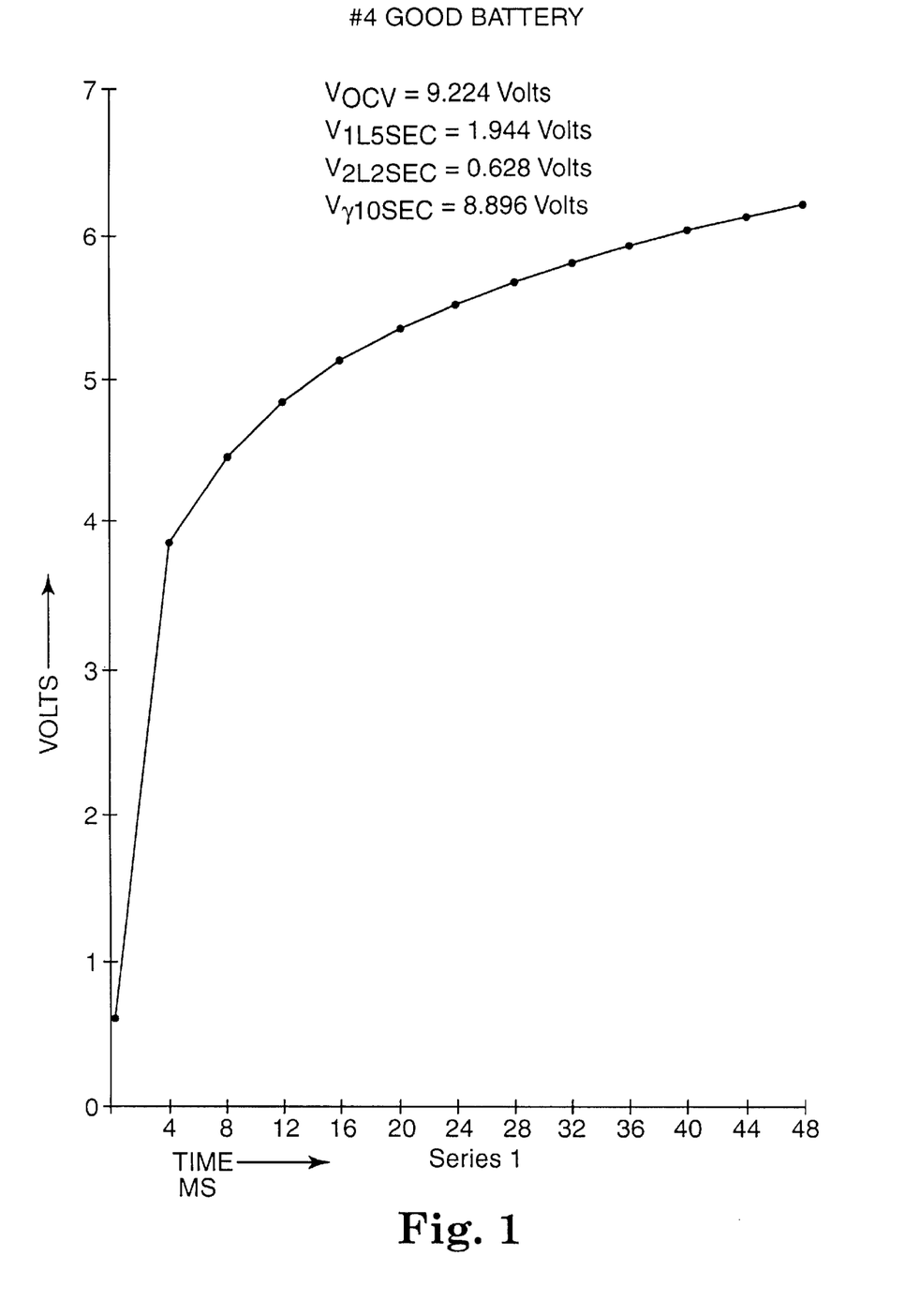
FIG. 1 is a graph of times versus volts for a good battery exhibiting voltage recovery pattern having capacitor-like properties.
Figure 2:
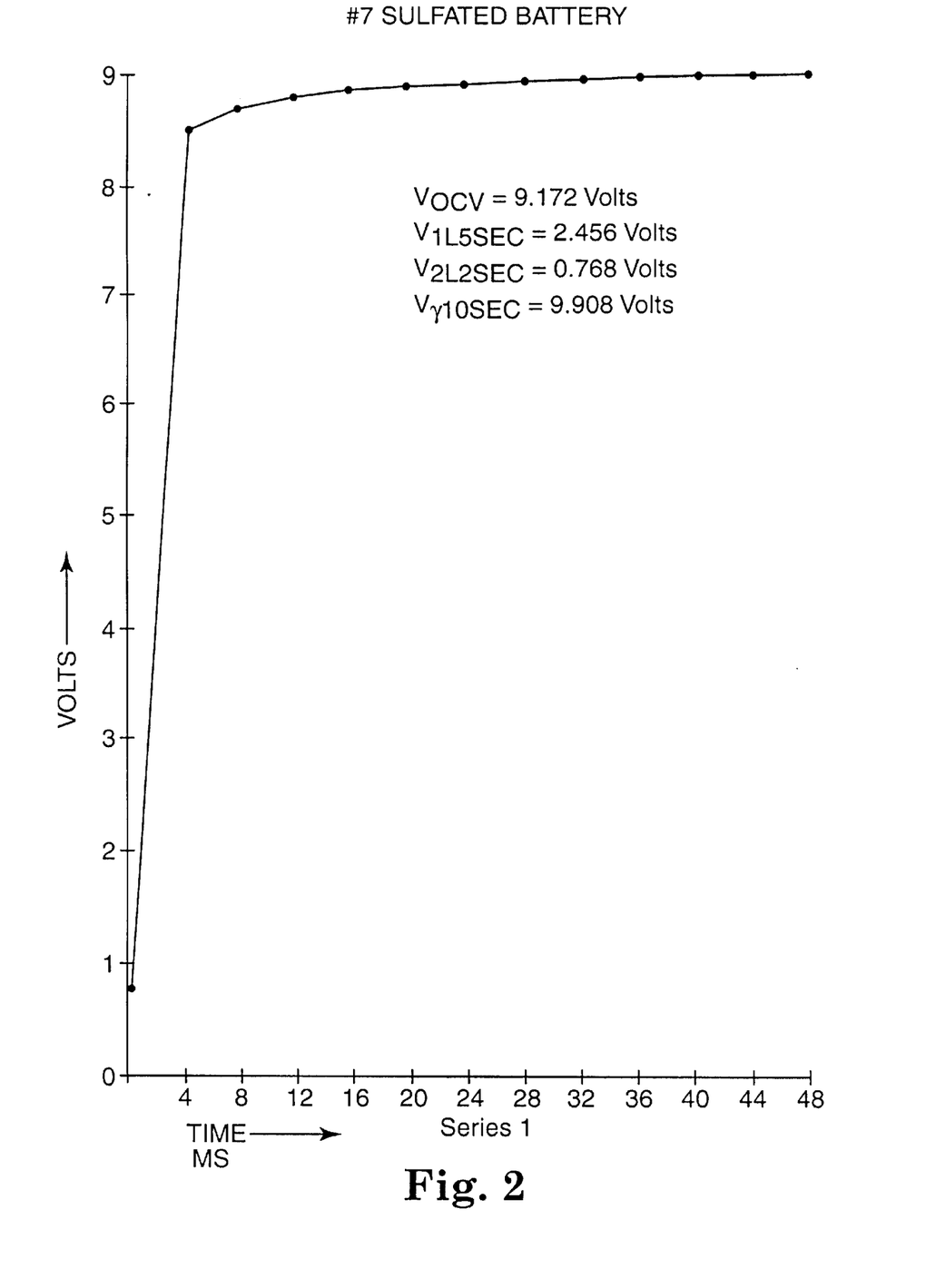
FIG. 2 is a graph of volts versus time for a battery exhibiting the quick voltage recovery wave form of defective sulfated battery.
Figure 3:
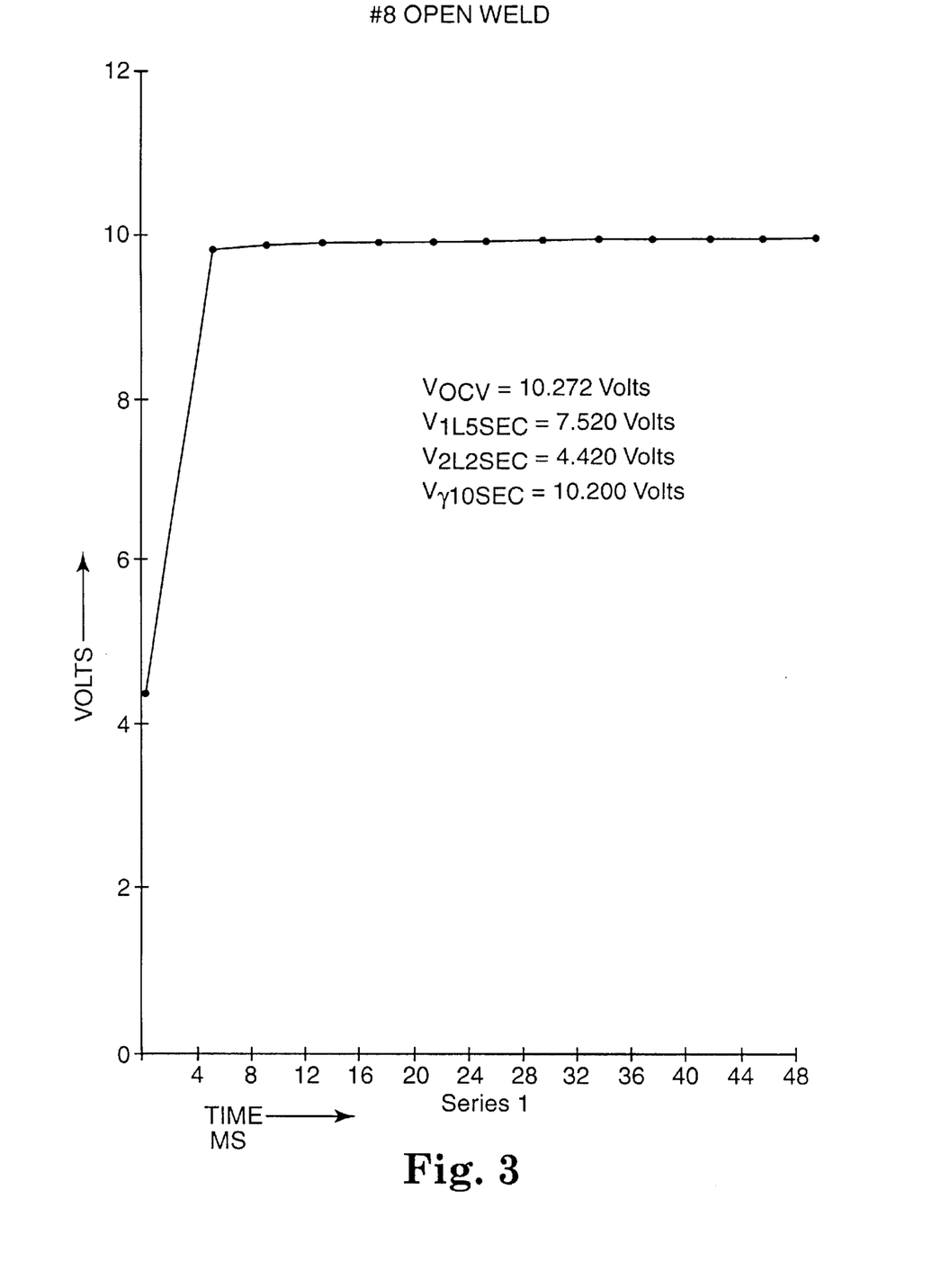
FIG. 3 is a graph of time versus volts for a battery exhibiting a quick voltage recovery wave form of a defective open weld battery.

After both loads are removed under the present methods (and with the present device (20)), the battery recovery voltage is monitored for a period of time, for example ten seconds. This monitoring provides a recovery voltage wave form which may be analyzed. Gross faults show a very different recovery voltage curve as compared to good batteries in a similar state of charge. Some defective batteries recover most of the voltage very quickly whereas good batteries (always) recover a significant portion of the total recovery voltage very gradually with time and the rate of change of voltage gradually decreases with time. Analysis of this recovery voltage wave form (amount of rapid recovery compared to the recovery after a greater length of time) allows for diagnosis of a lot of defective batteries in a deeply discharged state. Good batteries, even in deep discharge state (always) show a significant amount of total recovery voltage increased gradually due to capacitive action of the battery (22) whereas some of the defective batteries recovered most of their voltage very quickly and show very little capacitive action during the rest of the recovery. A voltage recovery wave form of a good battery is shown in FIG. 1, and has an open circuit voltage of 9.224 volts, a voltage at the end of the first load of 1.944 volts, a voltage at the at the end of the second load (first load plus an additional load) of 0.628 volts, a voltage at 4 milliseconds after removal of the second load of about 3.9 volts, and a voltage at 10 seconds after removal of the second load of 8.896 volts. Batteries exhibiting rapid recovery of voltage are typically either badly sulfated or have an open weld. FIG. 2 shows the recovery voltage wave form of a (defective) sulfated battery and the sulfated battery has an open circuit voltage of 9.172 volts, a voltage at the end of the first load of 2.456 volts, a voltage at the end of the second load of 0.768 volts, a recovery voltage at ten seconds after removal of the second load of 9.908 volts, and a voltage at 4 milliseconds after removal of the second load of about 8.5 volts. FIG. 3 shows the recovery voltage wave form of a (defective) open weld battery and the open weld battery has an open circuit voltage of 10.272 volts, a voltage at the end of the first load of 7.520 volts, a voltage at the end of the second load of 4.420 volts, a voltage at ten seconds after the removal of the second load of 10.200 volts and a voltage at 4 milliseconds after the removal of the second load of about 9.8 volts. The end of the first load means the end of when the first load is the only load applied if an additional load is added to form the second load. In contrast to conventional methods where the deep discharge state of the battery results in the internal resistance or dynamic resistance of the battery being of no value for the purpose of diagnosing the condition of the battery by comparing it to the state of charge and size of battery, the present invention's method provides for a quick determination of whether various batteries are defective even in a deep discharge state. By utilizing the present method and device (20), even when batteries are in deeply discharged state, the behavior of the battery (22) exhibiting a capacitor-like response by the recovery voltage gradually recovering due to the capacitive action of the battery (22) separates many of the batteries from those that are defective which exhibit rapid voltage recovery and lack the capacitor-like behavior. This symptomatic test is useful for diagnosing batteries with gross defect. If a battery passes this test, it does not mean that the battery is a good battery, but it does eliminate some of the defective batteries and if the battery passes this test then it is preferably subject to additional testing.

Figure 4:
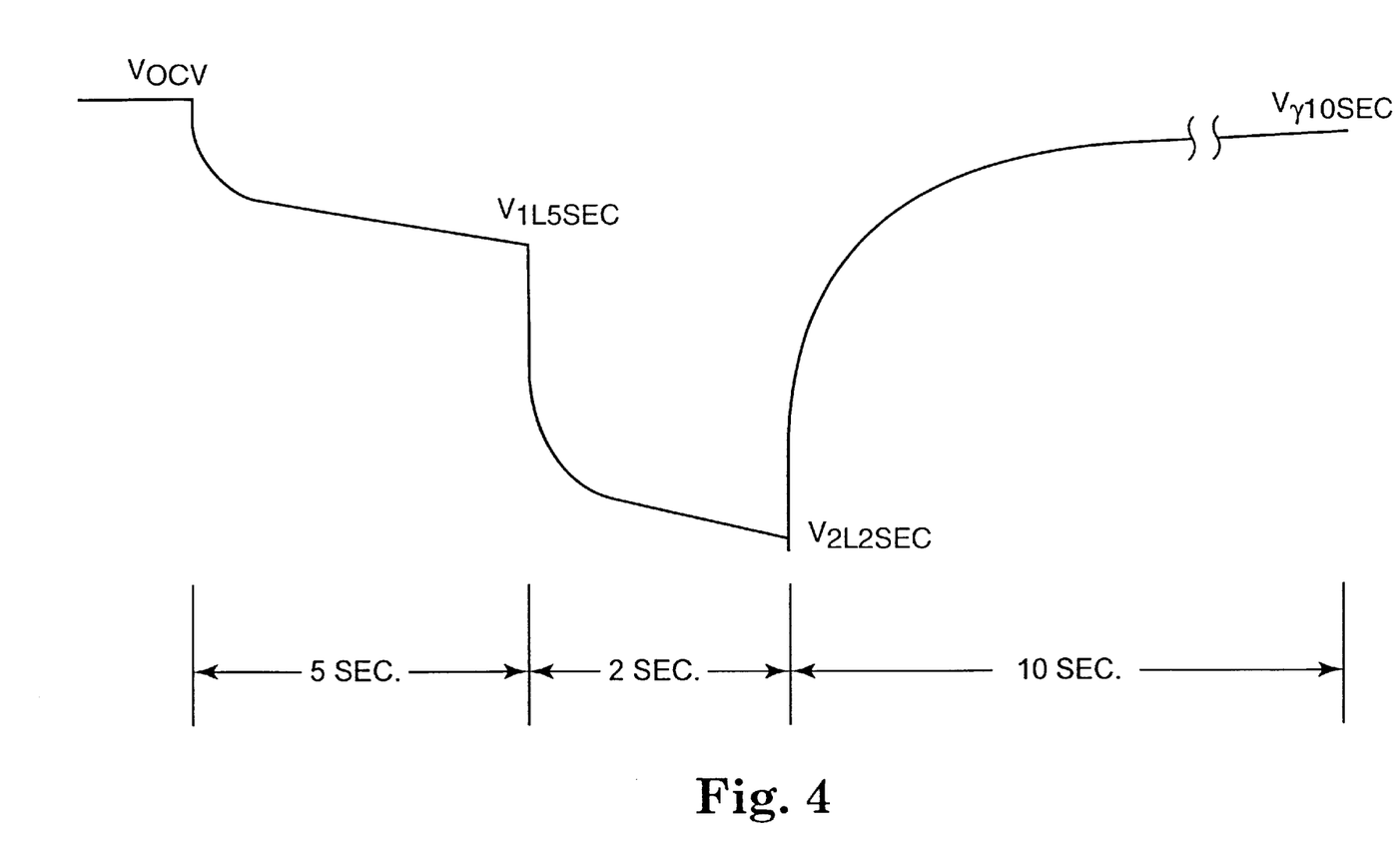
FIG. 4 is a graph of a voltage versus time pattern of a battery subject to a test according to the method of the present invention with the device of the present invention.

The recovery wave form analysis (Symptom Check #1), also referred to herein as capacitive recovery factor, is preferably calculated as follows: $(V_{recovery}-V_{shorttime})/(V_{recovery}-V_{secondload})$=CRF. Capacitive recovery factory (CRF) represents the ratio of the battery voltage recovered gradually due to capacitive action starting from a very short time period after the loads (or load) have been removed, for example 4 milliseconds, to the voltage at a longer time period, for example 10 seconds after the loads (or load) have been removed, to the total voltage recovered (by the battery in the longer period of time $(V_{recovery}-V_{secondload})$ (for example 10 seconds). FIG. 4 illustrates a voltage profile of a battery which is subjected to a first load, a second load and then allowed to recover. The profile of FIG. 4, shows the open circuit voltage, the voltage drop due to the application of the first load, the voltage at the end of the first load, the voltage drop due to the application of the second load, the voltage at the end of the second load, and the voltage recovery wave form after removal of the second load.

Good batteries even in deep discharged or completely discharged states always showed a CRF to be greater than 0.25 whereas batteries that had CRF values less than 0.25 were always found to be bad irrespective of their state of charge. This symptom check (Symptom Check #1) is a very successful method of diagnosing a large number of batteries in deep discharged state without needing to charge them. The good batteries in nearly full state of charge always showed CRF to be greater than 0.5, which means that more than half the voltage recovered gradually due to capacitive action, whereas the batteries in near full state of charge that had CRF less than 0.5 were found to be defective.

As set out above, the second load is larger than the first load, consequently a relatively larger voltage drop is expected due to the application of the second load as compared to the voltage drop caused by application of the first load. Additionally, if the voltage under the first load indicates that the battery (22) is in a fairly discharged state, the application of the second load should also support this fact by causing a relatively large voltage drop. An initial condition is preferably tested for and involves determining whether the initial voltage drop $(V_{OVC}-V_{1L5Sec})$ is greater than the second voltage drop $(V_{1L5Sec}-V_{2L2Sec})$ and determining whether the voltage at the end of the medium load (second load, first plus additional load) is greater than a predetermined level, for example four volts for a twelve volt battery. Since the second load is significantly higher than the first load, the terminal voltage drop due to the second load should be higher than the terminal voltage drop due to the application of the first load as long as the battery is not completely discharged. This check proves to be very effective for diagnosing batteries which have one or multiple bad cells without needing to charge them.

Additional conditions, Symptom Check #2, which can be used to determine whether batteries are defective involves determining whether the second voltage drop is below a certain level for the first load voltage being within a given range. For example, for a twelve volt battery, if the first voltage $(V_{smallload})$ is between 10.2 volts and 10.7 volts, and the second voltage drop $(V_{1L5Sec}-V_{2L2Sec})$ is less than 0.6 volts than the battery is defective. If the voltage at the end of the first load $(V_{1L5Sec}$ or $V_{smallload})$ is between 8.0 volts and 10.2 volts and the second voltage drop is less than 1.0 volts than the battery is defective. If the voltage at the end of the first load is between 6.0 volts and 8.0 volts and the second voltage drop is less than 1.2 volts then the battery is defective. In other words, the above condition tests involve determining the voltage of the battery at the end of the first load and determining the voltage drop between the voltage of the first load and the second load, then determining whether the voltage drop between the first load and second load is less than a certain level depending upon the voltage at the end of the first load. Or in other words, if the battery passes most of the above checks, then the incremental voltage drop $(V_{1L5Sec}-V_{2L2Sec})$, due to the application of the second load, is compared against a predetermined value depending on the size of the battery under test is useful for determining whether the battery is defective. If $(V_{1L5Sec}-V_{2L2Sec})$ is less than the predetermined value, the battery under test is diagnosed as a good battery. The voltage drop between the first load and second load, when compared to the size of the battery, proves to-be a very reliable factor for assessing the condition of the battery and is not influenced by the state of charge of the battery down to a very low charge level. If the battery passes the maximum allowed voltage drop tests and the above symptom one and symptom two checks, the battery is diagnosed as a good battery irrespective of its state of charge, and if a battery fails the maximum allowed voltage drop and $V_{1L5Sec}$ (voltage of first load) is greater than 12.2 volts, the battery is diagnosed as a defective battery. If the battery passed the symptom one check and the symptom two check, but failed the maximum allowed voltage drop test and the voltage at the end of the first fixed load $(V_{1L5Sec})$ is less than 12.2 volts, then operator is instructed to charge the battery and retest. Consequently, there is a possibility that charging may be required, but a great majority of the batteries will have been screened even at a deeply discharged level and thereby the percentage of batteries requiring charging for effective testing will have been greatly reduced by use of the method and device (20) of the present invention compared to conventional methods and devices.

Figure 5:
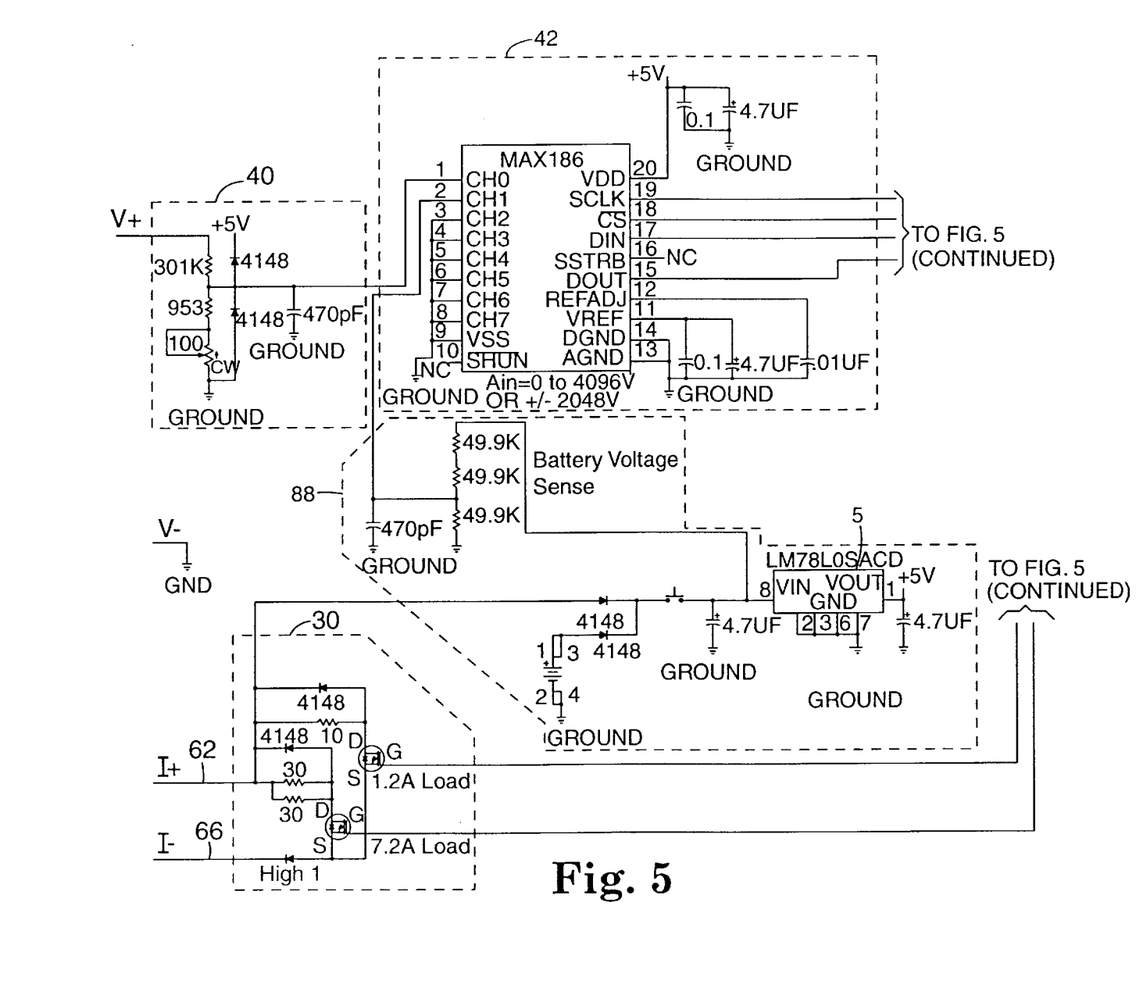
FIG. 5 is a schematic diagram of the electrical configuration of the device of the present invention.
Figure 7:
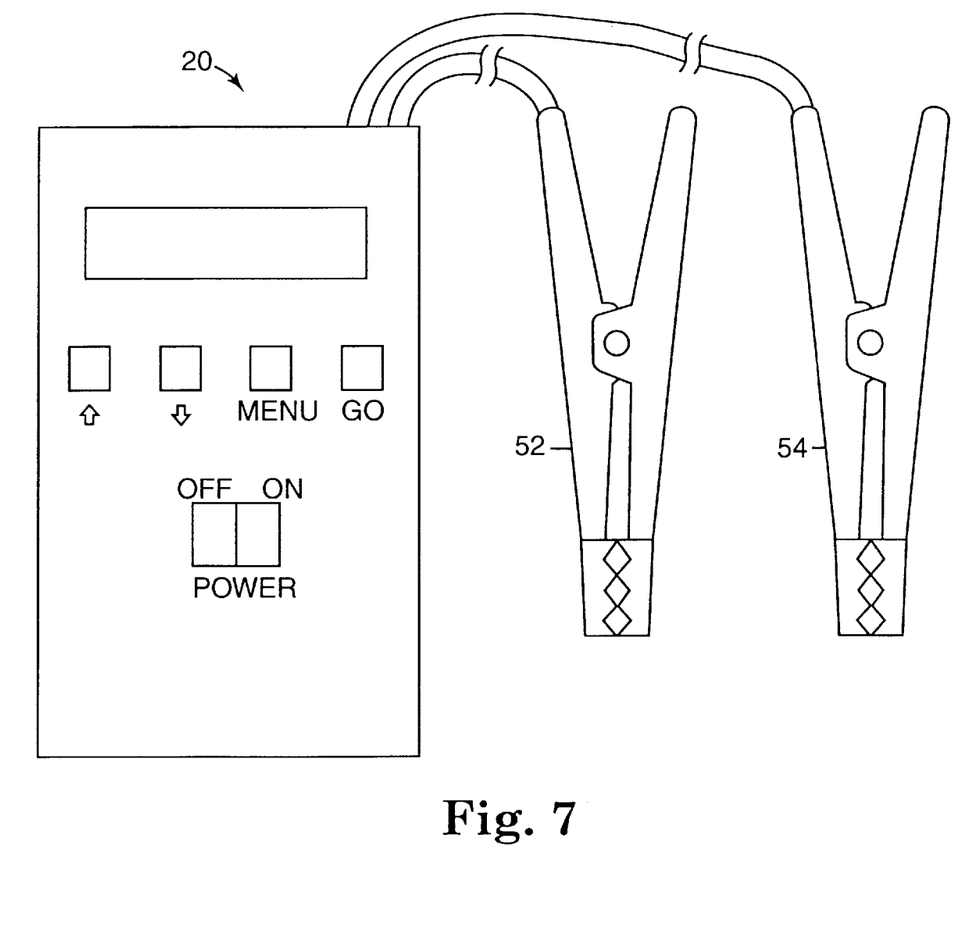
FIG. 7 is a perspective view of the device of the present invention.
Figure 9:
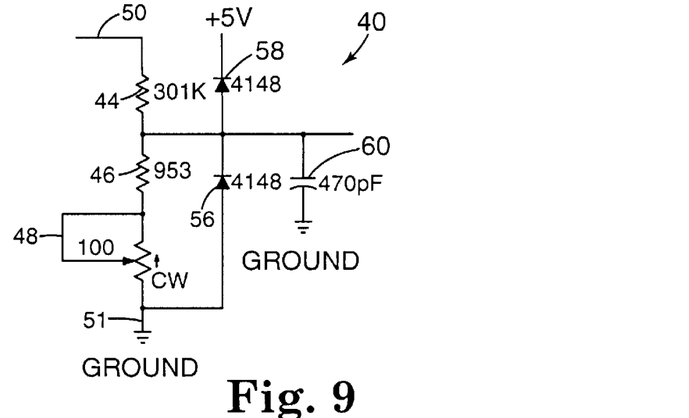
FIG. 9 is a schematic diagram of the electrical configuration of the battery voltage sense front end of the device of the present invention.

As best shown in FIG. 5, the device (20) of the present invention comprises six circuits (sections). The first section (40) is the battery voltage sense front end (voltage measurement circuit) (40). As best shown in FIG. 9, the voltage sense front end (40) comprises a lead connection (50, 51) to the battery clamps (52, 54), as best shown in FIG. 7, which is divided down to ¼ voltage through a 3.01 kilo ohm resistor (44), 953 ohm resistor (46)and 100 ohm (pot) variable resistor (48), to be adjusted in manufacturing to make LCD readout match a know voltage connected to the battery clamps (52, 54). After the divider, low leakage 1N4148 diodes (56, 58) to ground (GND) and +5 volts protect the divided voltage against transients and over/under voltage conditions. A 470 pf COG ceramic capacitor (60) to ground (GND) is connected to the divided voltage to stabilize the input to the A/D (analog to digital) converter (42).

Figure 10:
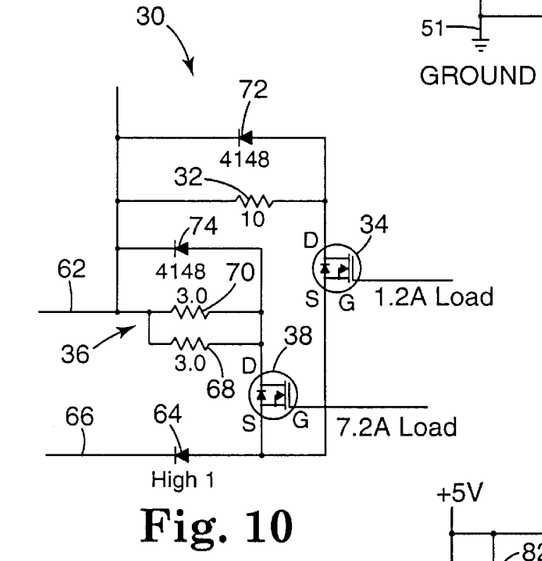
FIG. 10 is a schematic diagram of the electrical configuration of the battery loading section of the device of the present invention.

As best shown in FIG. 10, the second circuit (section) (30), is the battery loading section (30). Two International Rectifier IRLZ14 N-channel MOSFETS (gates, switches) (34, 38) are controlled individually by the microprocessor (24). Their sources are tied together and go to the anode of a General Semiconductor MBR1045GI schottky rectifier (64) for reverse lead hookup protection. The cathode of the rectifier (64) goes to battery negative clamp (52) using a lead (66) separate from the GND circuit lead (51) to the PCB. The low current MOSFET drain of the gate (34) goes to a 10 W 10 ohm wirewound resistor (32) whose other side connects to the battery positive clamp (54) using a lead (62) separate from the sense lead in section 1. The high current MOSFET drain of the gate (38) goes to two 10 W 3.0 ohm wirewound resistors (68, 70) in parallel (which together function as the second resistor (36) (R2)) whose other sides connect to the battery positive clamp (54) using the same lead (62) as the 10 ohm resistor. 1N4148 diodes (72, 74) are across the loading resistors (32, 36) to clamp the voltage at the MOSFETs drain when they turn off quickly.

Figure 11:
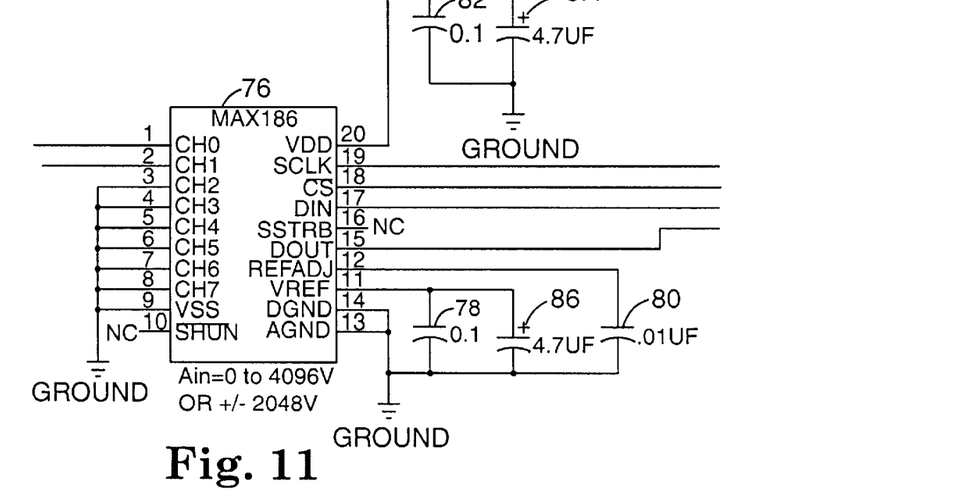
FIG. 11 is a schematic diagram of the electrical configuration of the analog-to-digital converter the device of the present invention.

As best shown in FIGS. 5 and 11, section (42) is the A/D (analog to digital) converter circuit (42). A Maxim MAX186BC 8-channel 12 bit A/D (analog-to-digital) converter element (76) is used with the ¼ battery voltage signal going into CH0, and a ⅓ supply battery voltage sense going into CH1. All other channels of the converter element (76) are grounded. The converter circuit (42) has ceramic capacitors (caps) (78,80,82) of 0.1 uF, and tantalum capacitors (caps) (84, 86) of 4.7 uF for supply voltage and ref voltage bypassing/filtering. A 3 wire SPI serial link (plus chip select) is used for communication between the A/D converter element (76) and the microcontroller (24).

Figure 12:
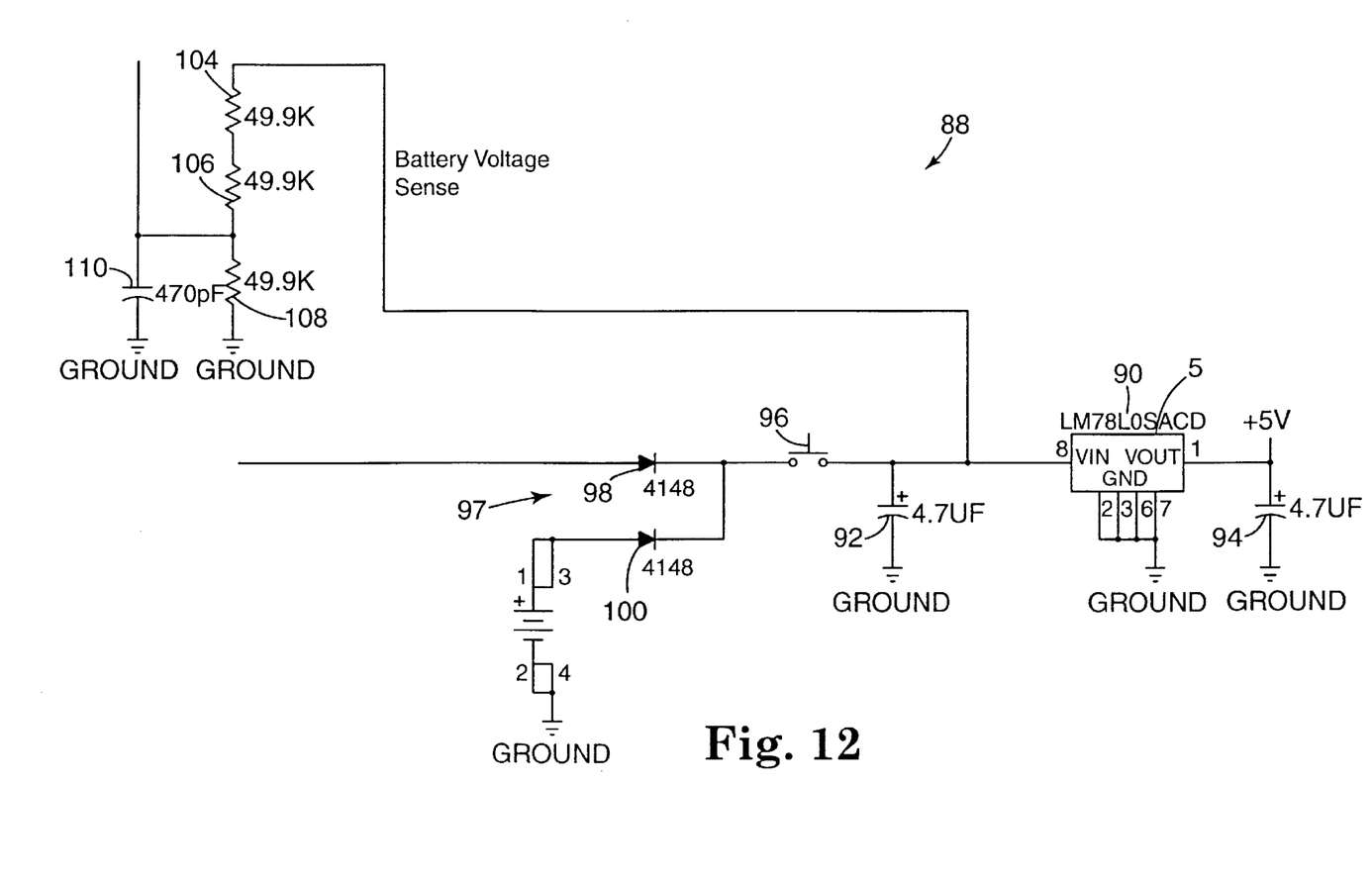
FIG. 12 is a schematic diagram of the electrical configuration of the PCB power supply section of the device of the present invention.

As best shown in FIG. 12, section (88) is the PCB power supply section (circuit) (88). A linear voltage regulator LM78L05 (90) is used, with 4.7 uF tantalum capacitors (92, 94) filtering on both input and output, to provide a regulated +5V +/−5% to the circuitry on the PCB. A power supply on/off switch (96) is in front of the regulator (90). The input side to the switch (96) takes the 1N4148 diode oring (97) (diodes (98), (100)) of the power supplied from the internal 9V battery (102) and the high current load lead (62) to the battery positive clamp (54). This diode oring (97) (diodes (98), (100)) assures operation when not connected to a test battery, or when the test battery voltage drops below regulator desired minimum input during the loading test. A ⅓ regulator input voltage is formed using three 49.9 kiloohm resistors (104, 106, 108) and 470 pF filtering capacitor (110). This voltage is fed into CH1 of the A/D in case the software wants to read the internal battery voltage when not connected to a test battery.

Figure 13:
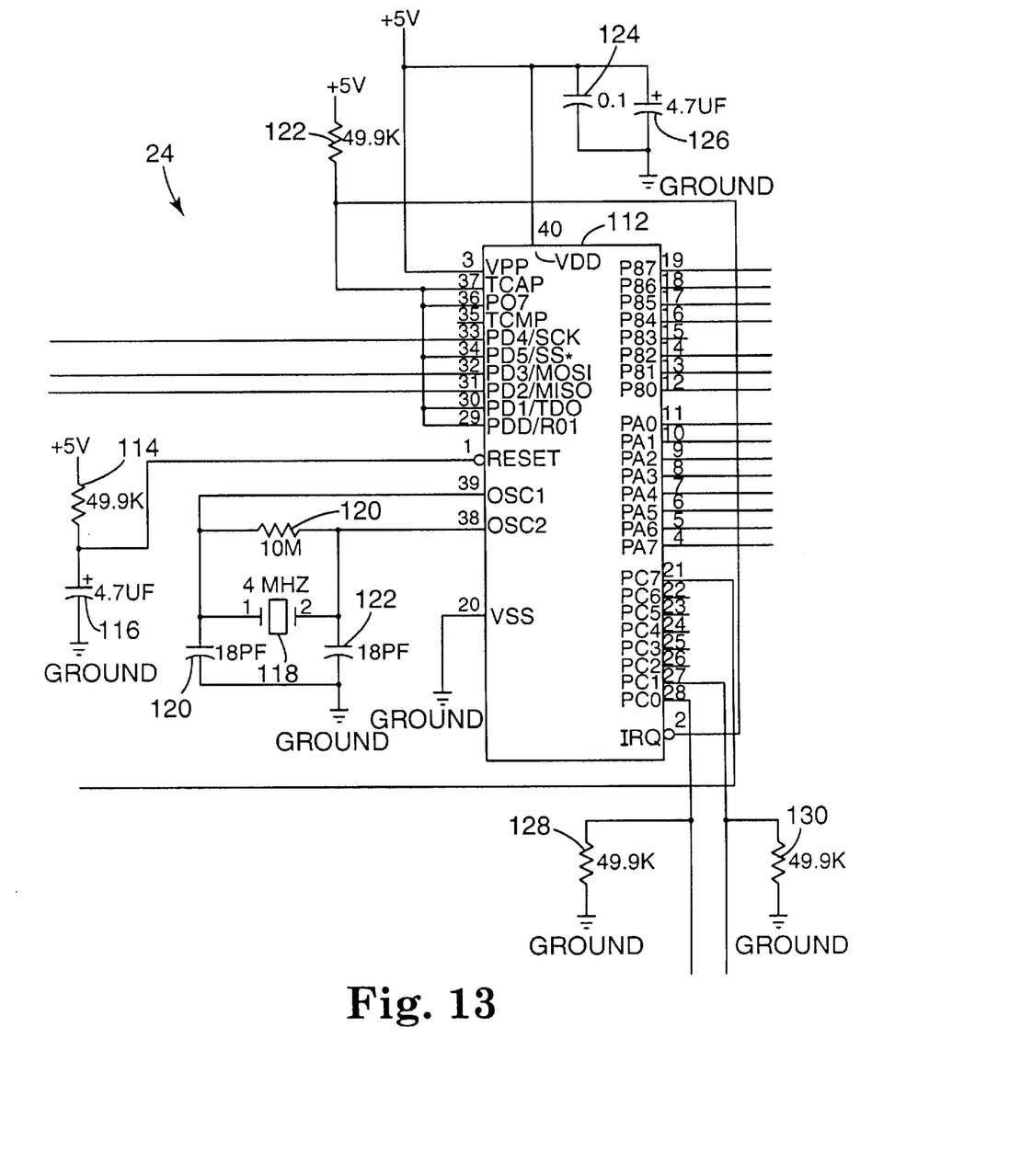
FIG. 13 is a schematic diagram of the electrical configuration of the microcontroller unit section of the device of the present invention.

As best shown in FIG. 13, section (24) is the microcontroller section (microprocessor circuit)(24). A Motorola MC68HC705C8AC microcontroller element (112) is used to perform the testing and to create the display messages. It is an 8-bit CPU with on board OTP PROM and SRAM and an SPI serial port for communicating with the A/D converter (42). The microcontroller element (112)requires a reset RC combination of 49.9 kiloohm resistor (114) and 4.7 uF (microfarads) capacitor (116). The microcontroller element (board)(112) also requires a 4.000 MHZ ECS ECS-40-20-4 parallel resonant quartz crystal (118) connected to two 18 pF ceramic capacitors (120, 122), and a 10 Mohm resistor (120) for proper oscillation. The microcontroller has unused inputs pulled to +5V through a 49.9 kohm resistor (122). The microcontroller power pin also requires a 0.1 uF ceramic capacitor (124) and 4.7 uF tantalum capacitor (126) for bypassing to ground. Two 49.9 Kohm resistors (128, 130) pull down the MOSFET control lines so the loads are off when the microcontroller has not initialized the port control lines yet.

Figure 8:
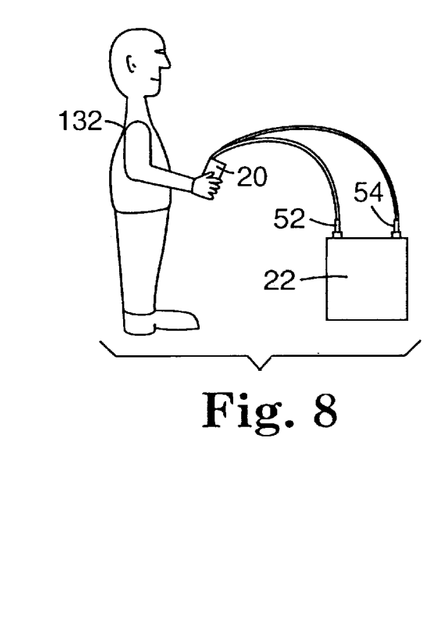
FIG. 8 is a prospective view of the device of the present invention being used by the user on an automobile having an automotive lead acid battery.
Figure 14:
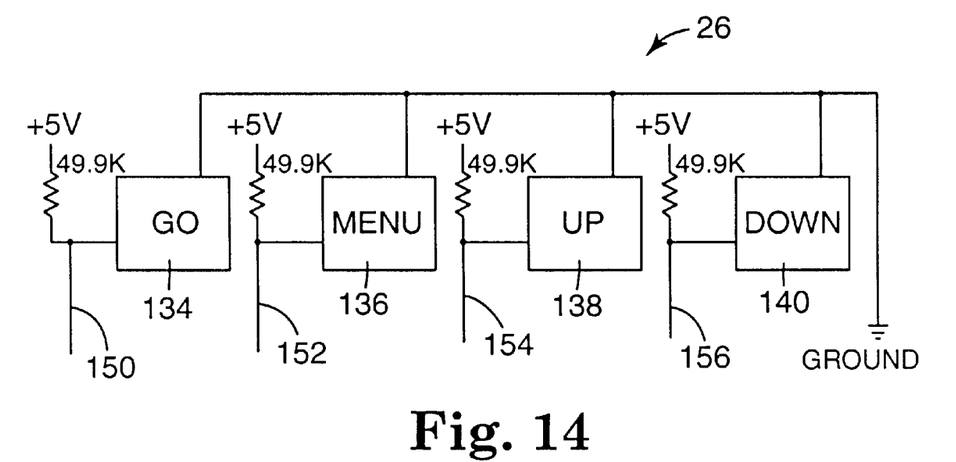
FIG. 14 is a schematic diagram of the electrical configuration of the custom input keypad of the device of the present invention.

As best shown in FIG. 14, section (26) is the custom input key pad (keyboard) section (circuit) (26). The unit (20) requires input from the user (132), as best shown in FIG. 8, before, during and after the battery test wherein the device (20) is connected to the battery (22) by clamps (52, 54) to the respective battery terminals. Each of the four keys (134, 136, 138, 140) has one side of their switch going to a port line (150, 152, 154, 156) on the microcontroller board (112), for level sensing. Four keys (134, 136, 138, 140) on a membrane keypad have their contacts shorted to GND when the user (132) presses each key. When not pressed, a 49.9 kohm resistor (142, 144, 146, 148) on each of the 4 key sense lines, pulls the floating line to +5V. The keys represent UP (138), DOWN (140), MENU (136) and GO (134). The keys have various definitions depending on where they are need in the test.

Figure 15:
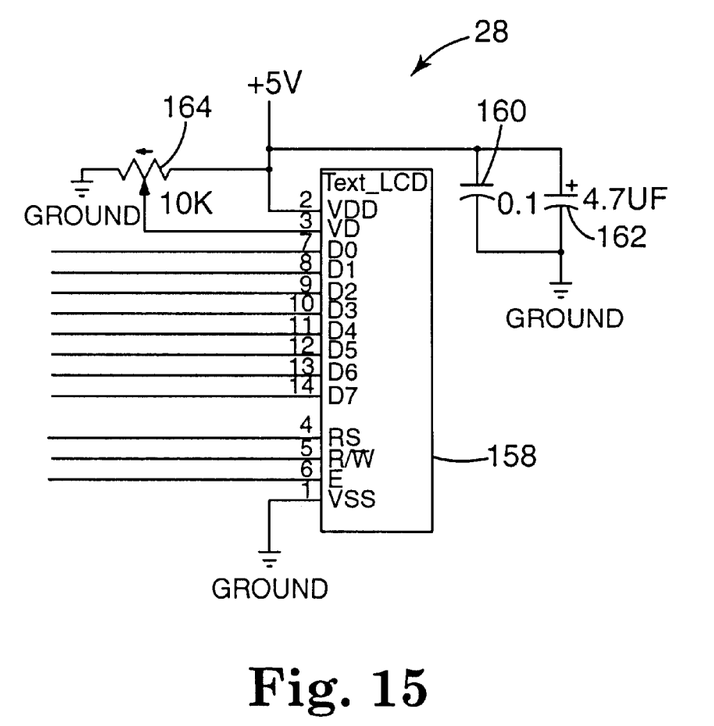
FIG. 15 is a schematic diagram of the electrical configuration of the liquid crystal display section of the device of the present invention.

As best shown in FIG. 15, section (28) is the liquid crystal (LCD) display section circuit (28). A Samsung two line by 16 position character display panel (158) is used to convey information to the user (138). There is a 1 line interface to the microcontroller, which comprises an eight bit data bus, RS register select line, R/W* read/write line, and E enable line. All eleven lines go to bi-directional port lines on the microcontroller. The LCD power pin also requires a 0.1 uF ceramic capacitor (160) and 4.7 uF tantalum capacitor (162) for bypassing to ground. The LCD display panel has a contrast control pin that must be adjusted at final assembly. This is accomplished with a 10 kiloohm pot (resistor) (164) with a wiper going to the LCD pin3, and the pot's other ends going to +5V and GND.

What is claimed is:

1. A method for evaluating the condition of a direct current energy storage unit, said method comprising:
   (a) applying a first load to said unit for a first time period,
   (b) measuring a first voltage of said unit at the end of said first time period,
   (c) applying a second load to said unit for a second time period, said second load being greater than said first load,
   (d) measuring a second voltage of said unit at the end of said second time period,
   (e) analyzing the condition of said unit based on the voltage drop between said first voltage and said second voltage, and
   (f) monitoring a recovery voltage of the unit for a predetermined time period after removing the second load.

2. The method of claim 1 wherein said first load is between 0.5 and 1.4 amps and is applied for a first time period of between three seconds and seven seconds, said second load being between 6.0 and 8.0 amps and being applied for a second time period of between one second and four seconds.

3. The method of claim 1 wherein said step of monitoring the recovery voltage of the unit for a predetermined time period includes the step of measuring the recovery voltage of the unit for at least three seconds after removing the second load.

4. The method of claim 3 wherein said method comprises analyzing the recovery voltage to determine the condition of the battery.

5. The method of claim 4 wherein said recovery voltage is analyzed to determine the capacitive action of the battery.

6. The method of claim 1 wherein said analyzing comprises utilizing the first voltage to determine the state of charge of the battery.

7. The method of claim 1 wherein said analyzing comprises comparing a voltage drop from the first voltage to the second voltage to determine the condition of the battery.

8. The method of claim 1 wherein said analyzing comprises comparing a first voltage drop between an open circuit voltage and the first voltage to a second voltage drop between the first voltage to the second voltage.

9. The method of claim 8 wherein said analyzing comprises determining whether the first voltage drop is larger than the second voltage drop.

10. The method of claim 8 wherein said unit is an automotive battery having a designed full voltage of about 12 volts, said analyzing comprising determining whether the first voltage drop is greater than the second voltage drop, and determining whether the second voltage is larger than 4.0 volts.

11. A method for evaluating the condition of a battery having a state of charge, said method comprising:
applying a first load to the battery for a first time period;
measuring a first voltage of the battery at the end of said first time period;
applying a second load to the battery for a second time period, said second load being greater than said first load;
measuring a second voltage of the battery at the end of the second time period;
monitoring a recovery voltage of the battery for a predetermined time period after removing the second load, including measuring a first recovery voltage after a first recovery time period, measuring a second recovery voltage after a second recovery time period; and
determining the condition of the battery using the first voltage or the second voltage, and monitoring the recovery voltage, including determining whether the battery is defective irrespective of the battery state of charge including the steps of determining a capacitive recovery factor, defining a capacitive recovery factor threshold, and comparing the capacitive recovery factor to the capacitive recovery factor threshold.

12. The method of claim 11, wherein the capacitive recovery factor threshold is 0.25.

13. The method of claim 11, wherein the step of determining a capacitive recovery factor includes determining the ratio of the second recovery voltage minus the first recovery voltage to the second recovery voltage minus the second voltage.

14. The method of claim 11, further comprising the step of defining the second recovery time period as being at least ten times greater than the first recovery time period.

15. The method of claim 11, further comprising the step of defining the first recovery time period as less than ten milliseconds and defining the second recovery time period as more then 2 seconds.

16. The method of claim 11, further comprising the step of defining the second time period as less than the first time period.

17. The method of claim 11, wherein the second load is more than 4 times greater than the first load.

18. The method of claim 11, further comprising the steps of determining an open circuit voltage, and determining a condition of the battery based on whether the open circuit voltage minus the first voltage is greater than the first voltage minus the second voltage.

19. The method of claim 18, wherein the step of determining a second condition includes the steps of defining a threshold voltage and comparing the second voltage to the threshold voltage.

20. An electronic device for determining whether a battery is defective, the device comprising:
means for applying a first load to the battery for a first time period;
means for measuring a first voltage of the battery at the end of said first time period;
means for applying a second load to the battery for a second time period, said second load being greater than said first load;
means for measuring a second voltage of the battery for a second time period;
means for monitoring a recovery voltage of the battery for a predetermined time period after removing the second load, including means for measuring a first recovery voltage after a first recovery time period, means for measuring a second recovery voltage after a second recovery time period, wherein the second recovery time period is greater than the first recovery time period; and
means for determining the condition of the battery using the first voltage or the second voltage, and means for monitoring the recovery voltage, including means for determining whether the battery is defective irrespective of the battery state of charge including means for determining a capacitive recovery factor, means for defining a capacitive recovery factor threshold, and means for comparing the capacitive recovery factor to the capacitive recovery factor threshold.

21. The device of claim 20, wherein the capacitive recovery factor threshold is 0.25.

22. The method of claim 20, wherein the means for determining a capacitive recovery factor includes means for determining the ratio of the second recovery voltage minus the first recovery voltage to the second recovery voltage minus the second voltage.

23. The method of claim 20, further wherein the second recovery time period is at least ten times greater than the first recovery time period.

24. The method of claim 20, further wherein the first recovery time period as less than ten milliseconds and defining the second recovery time period as more then 2 seconds.

25. The method of claim 20, further wherein the second time period as less than the first time period.

26. The method of claim 20, wherein the second load is more than 4 times greater than the first load.

* * * * *